(12) United States Patent
Bunzey et al.

(10) Patent No.: US 6,333,637 B1
(45) Date of Patent: Dec. 25, 2001

(54) ELECTRONIC CARD ASSEMBLY FIXTURE

(75) Inventors: William E. Bunzey, Charlotte; Rodger A. Byers, Concord, both of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/169,692

(22) Filed: Oct. 9, 1998

(51) Int. Cl.$^7$ ................................................. G01R 31/02
(52) U.S. Cl. ........................................ 324/761; 324/754
(58) Field of Search .................................... 324/761, 762, 324/754, 758

(56) References Cited

U.S. PATENT DOCUMENTS

| | | | |
|---|---|---|---|
| 3,970,934 | * 7/1976 | Aksu | 324/761 |
| 4,063,172 | 12/1977 | Faure et al. | |
| 4,714,879 | * 12/1987 | Krause | 324/761 |
| 4,749,943 | * 6/1988 | Black | 324/754 |
| 4,857,009 | 8/1989 | Christensen . | |
| 4,950,980 | 8/1990 | Pfaff . | |
| 5,068,601 | 11/1991 | Parmenter . | |
| 5,180,975 | 1/1993 | Andoh et al. . | |
| 5,471,148 | 11/1995 | Sinsheimer et al. . | |
| 5,644,246 | 7/1997 | Lee et al. . | |
| 5,966,023 | * 10/1999 | Burgers et al. | 324/761 |
| 6,051,983 | * 4/2000 | Watts | 324/761 |

FOREIGN PATENT DOCUMENTS 1019679   5/1983   (SU) .

OTHER PUBLICATIONS

IBM Technical Disclosure Bulletin vol. 27, No. 2, Jul. '84.
IBM Technical Disclosure Bulletin vol. 40, No. 5, May 1997.

* cited by examiner

*Primary Examiner*—Safet Metjahic
*Assistant Examiner*—Jermele M. Hollington
(74) *Attorney, Agent, or Firm*—Salzman & Levy; Lawrence R. Fraley

(57) ABSTRACT

A test fixture is described which includes a camming assembly for eliminating misalignments in the probe testing of electronic card assemblies. The test fixture provides a pair of cams oppositely situated from the probes of a Side Access Unit (SAU). These cams are pneumatically actuated slightly prior to, or instantaneously with, the SAU. The actuation of the cams provides a mechanical stop with zero tolerance, so that the misalignment of test pads and probes, caused by the forward movement of the test probes, is eliminated.

21 Claims, 5 Drawing Sheets

ELECTRONIC CARD ASSEMBLY FIXTURE

FIELD OF THE INVENTION

The present invention relates to electronic card assemblies that are probe tested using a pneumatic actuated Side Access Unit (SAU) and, more particularly, to an electronic card assembly test fixture that prevents misalignment of the test probe of the SAU with respect to the test pads of the electronic card.

BACKGROUND OF THE INVENTION

Electronic card assemblies are tested prior to shipment with a vacuum test fixture. The cards are tested by inserting a probe into the card edge connector by means of a pneumatic actuated Side Access Unit (SAU). The force created by the SAU displaces the card in the same direction of the force being applied. This movement can cause the test probes in the test fixture to become perturbed or misaligned with the test pad of the card being tested, preventing adequate probe contact with the test pad.

Test pads on the electronic card require precise alignment, and are located on 25 mil and 50 mil centers. The test pad diameters are small, as little as 20 mils in diameter. Therefore, the test probe of the SAU, when misaligned by as little as 0.003" to 0.005" due to test pad movement, can result in testing inaccuracies.

It has been suggested that stationary, or permanently located mechanical stops could be used to oppose the SAU-generated displacement. However, the dimensional tolerances of the finished edge of the electronic card are too great for this scheme to work.

The present invention reflects the discovery that a card edge opposer cam assembly can provide a mechanical stop having a zero tolerance. The opposer cam of the assembly is pneumatically actuated from a common pneumatic system that serves the SAU. The opposer cam is placed against the edge of the electronic card opposite the edge associated with the SAU. This occurs before the SAU is pneumatically engaged. In this manner, the force generated by the SAU is prevented from moving the card test pads out of alignment with the probes.

DISCUSSION OF RELATED ART

In U.S. Pat. No. 4,063,172, issued to Faure et al on Dec. 13, 1977, for MULTIPLE SITE, DIFFERENTIAL DISPLACEMENT, SURFACE CONTACTING ASSEMBLY, a multiple site probe is illustrated. The probes are used to test points on an assembly. The test is performed with the test probes disposed 90 degrees to the horizontal position of the assembly being tested. The test device does not ensure that the assembly being tested is precisely held in alignment. By contrast, the card edge opposer cam of this invention precisely holds the card being tested in alignment in the "X" axis and in the "Y" axis.

In U.S. Pat. No. 4,857,009, issued on Aug. 15, 1989 to Christensen, for FIXTURE LATCHING MECHANISM, a test fixture is shown. The test fixture is aligned to a tester interface on the Hewlett Packard Test Platform. This is the same type of test platform shown in the electronic card assembly of the present invention, but the device does not align the card being tested in the test fixture.

In U.S. Pat. No. 4,950,980, issued to Pfaff on Aug. 21, 1990, for TEST SOCKET FOR ELECTRONIC DEVICE PACKAGES, a socket having an array of terminals is illustrated. The socket is adapted to interconnect with a high pin density integrated circuit. The device tests dual-in-line packages (DIPS). The DIPS are components that are installed on electronic card assemblies to make up the completed assembly. This device is not related to the testing of electronic card assemblies prior to their shipment to the customer.

In U.S. Pat. No. 5,068,601, issued on Nov. 26, 1991 to Parmenter, for DUAL FUNCTION CAM-RING SYSTEM FOR DUT BOARD PARALLEL ELECTRICAL INTERCONNECTION AND PROBER/HANDLER DOCKING, a device under test (DUT) board connection is illustrated. The device has a circular design that does not conform to the rectangular perimeter of electronic card assemblies. The device tests semiconductors, the components that make up electronic card assemblies.

In U.S. Pat. No. 5,180,975, issued to Andoh et al on Jan. 19, 1993, for POSITIONING DEVICE AND IC CONVEYOR UTILIZING THE SAME, a device is shown for testing integrated circuit components that make up a completed electronic card assembly.

In U.S. Pat. No. 5,471,148, issued on Nov. 28, 1995 to Sinsheimer et al, for PROBE CARD CHANGER SYSTEM AND METHOD, a probe system is shown. The system is not related to testing completed electronic card assemblies, the probe being used to test semiconductor wafers.

In U.S. Pat. No. 5,644,246, issued to Lee et al on Jul. 1, 1997, for PROBE CARD LOCKING DEVICE OF A SEMICONDUCTOR WAFER PROBE STATION, a locking device is shown. The locking device tests semiconductor wafers and, again, is not related to testing completed electronic card assemblies.

In the IBM TECHNICAL DISCLOSURE BULLETIN, Vol. 27, No. 2, dated July 1984, a fixture is shown for feeding and registering circuit boards of different lengths.

In Soviet Union Patent No. 10,119,679, a device is illustrated for testing electronic card ASMs. The test probes of this device are engaged vertically in the "Z" axis. Alignment does not appear to depend upon any force applied along the "X" or "Y" axes. By contrast, the card edge opposer cam of the present invention provides a mechanical stop to maintain precise alignment.

SUMMARY OF THE INVENTION

In accordance with the present invention, there is provided a test fixture for an electronic card assembly. The electronic card assemblies are probe tested by pneumatically actuating a Side Access Unit (SAU), which makes contact with the test pads of the card assembly. The test pad diameters are as small as 20 mils, and are located on 25 mil and 50 mil centers. These very exacting tolerances require precise alignment with the test probe. However, when a test probe is advanced into position to test these pads, its forward movement imparts a forward movement to the test pads, thus misaligning the probe with respect to the test pads.

The test fixture provides a pair of cams oppositely situated from the SAU. These cams are pneumatically actuated slightly prior to, or instantaneously with, the SAU. The actuation of the cams provides a mechanical stop with zero tolerance, so that the misalignment caused by the forward movement of the test probes is eliminated. The pneumatically actuated cams provide an opposing force that counteracts the force imparted by the probes of the SAU, and is accurate up to 0.025" variation in the dimensions of the card edge. The test fixture provides alignment in both the "X" and "Y" axes.

The pneumatically actuated cams of the fixture each comprises a rounded card contact surface on a first, distal end about which each cam pivots. Each cam is rotatively connected to a mounting bracket at this first distal end. The connection is accomplished by a first pin that is disposed in a first hole in the cam, and which aligns with a hole in the mounting bracket. The mounting bracket is in turn attached to a pneumatic cylinder at an opposite end. The piston of the pneumatic cylinder is attached to a second distal end of the cam, and provides the force that causes the cam to pivot about its first distal end. The piston is attached to the second distal end of the cam through a second pin. The second pin is rotatively disposed in a second hole of the cam, and is guided in a slot formed in a pivot block attached adjacent the cam and its second cam hole. As the piston pushes the second pin, the cam is caused to pivot about its first pin, causing its rounded surface on the first distal end to come into camming contact with the card edge.

It is an object of this invention to provide an improved test fixture for an electronic card assembly.

It is another object of the invention to provide a test fixture for an electronic card assembly that prevents misalignment caused by probes of the Side Access Units.

BRIEF DESCRIPTION OF THE DRAWINGS

A complete understanding of the present invention may be obtained by reference to the accompanying drawings, when considered in conjunction with the subsequent detailed description, in which.

For purposes of brevity and clarity, like elements and components will bear the same designation throughout the figures.

DESCRIPTION OF THE PREFERRED EMBODIMENT

Generally speaking, the invention features a test fixture having a camming assembly for eliminating misalignments in the probe testing of electronic card assemblies. The test fixture provides a pair of cams oppositely situated from the probes of the Side Access Units. These cams are pneumatically actuated slightly prior to, or instantaneously with, the SAU. The actuation of the cams provides a mechanical stop with zero tolerance, so that misalignment caused by the forward movement of the test probes is eliminated.

Figure 1:
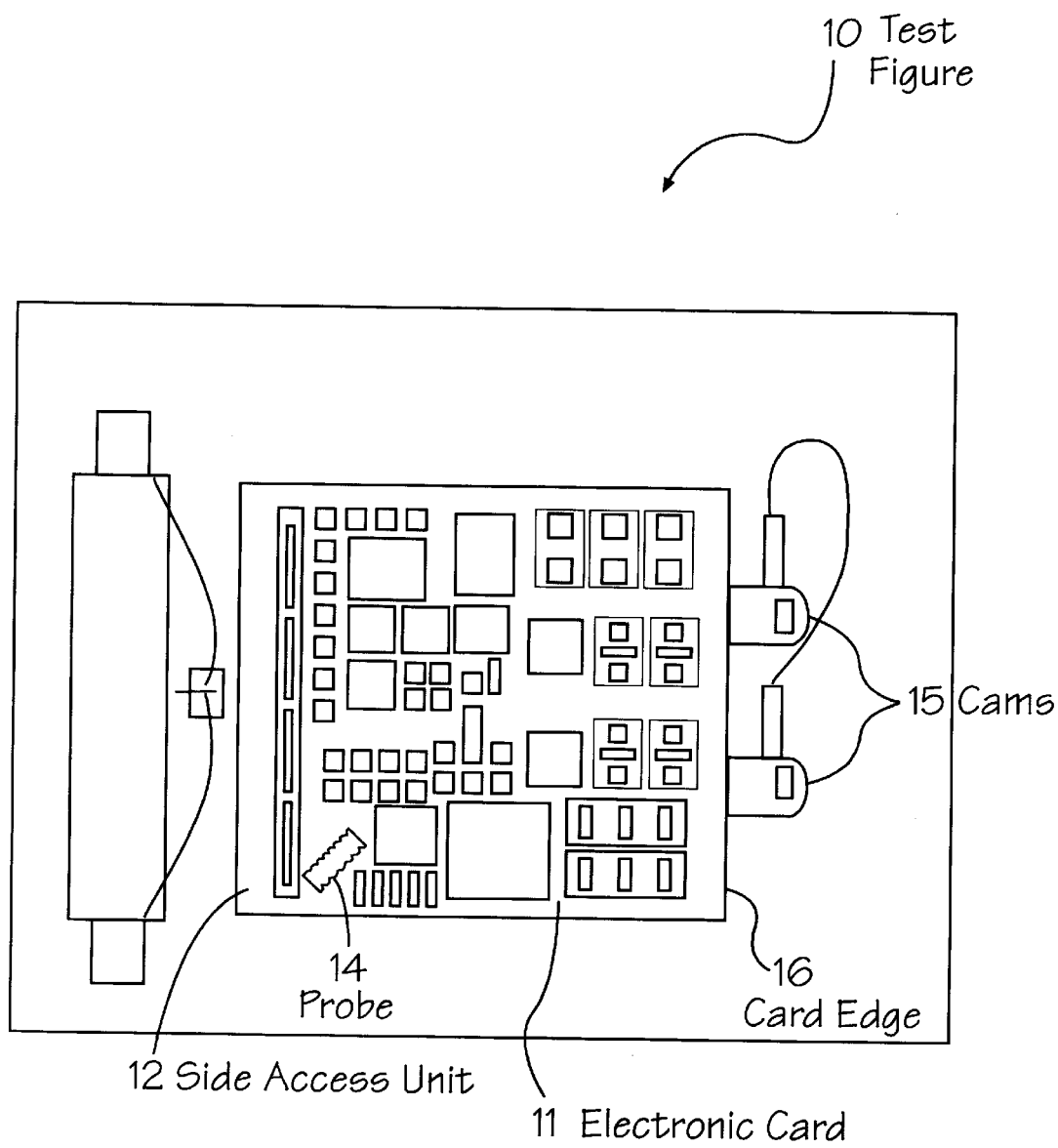
FIG. 1 illustrates an in situ top view of the electronic card assembly test fixture of this invention.

Now referring to FIG. 1, the test fixture 10 of this invention is illustrated. The test fixture 10 accommodates the electronic card 11 under test. The card 11 is probe tested by the Side Access Unit 12, as shown. The thrust of the probe 14 is counteracted by pneumatically actuating opposer cams 15, which make contact with the card edge 16.

Figure 2:
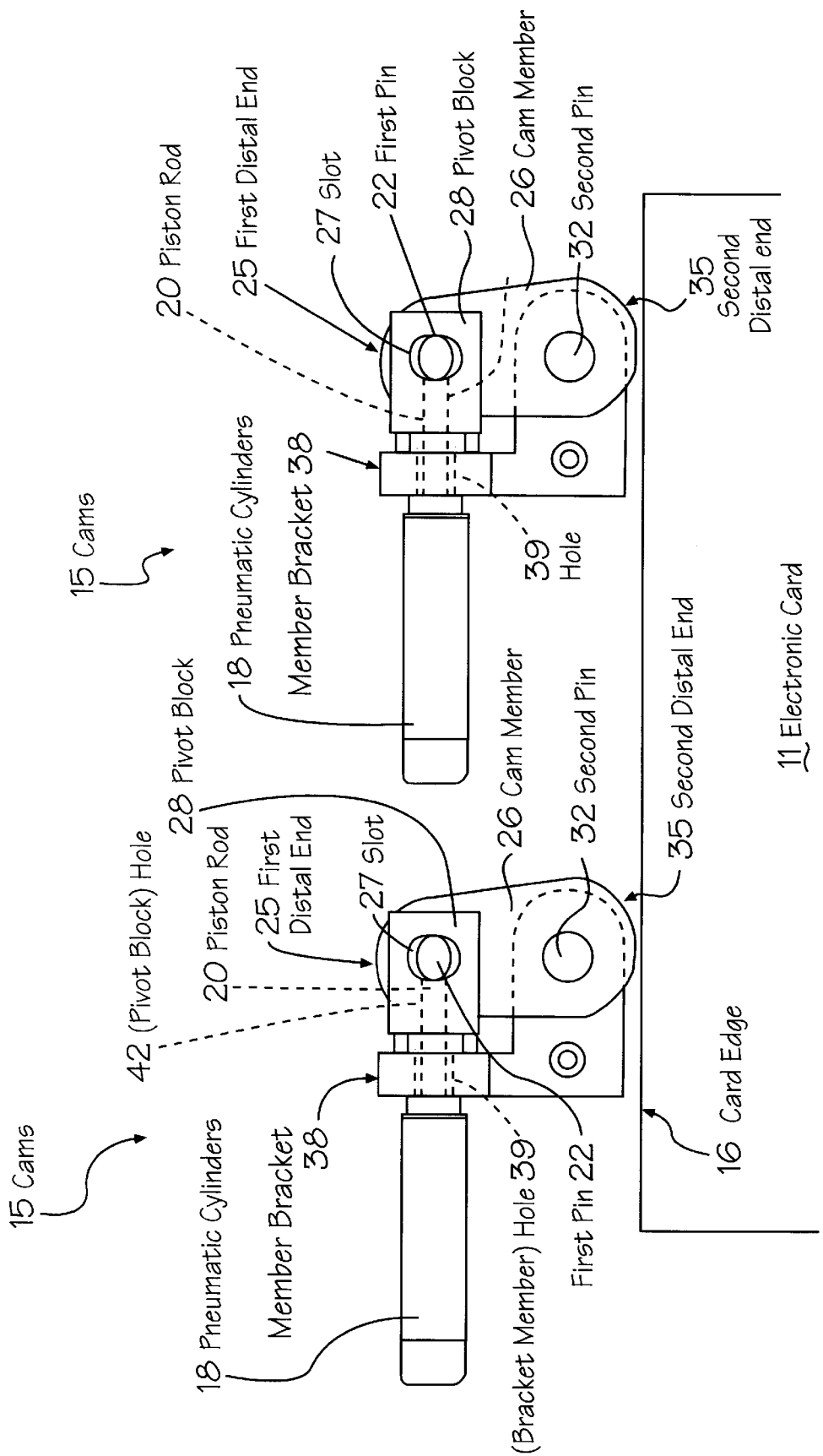
FIG. 2 depicts an in situ side view of the camming assembly of the test fixture disposed adjacent an edge of the electronic card assembly under test.
Figure 3A:
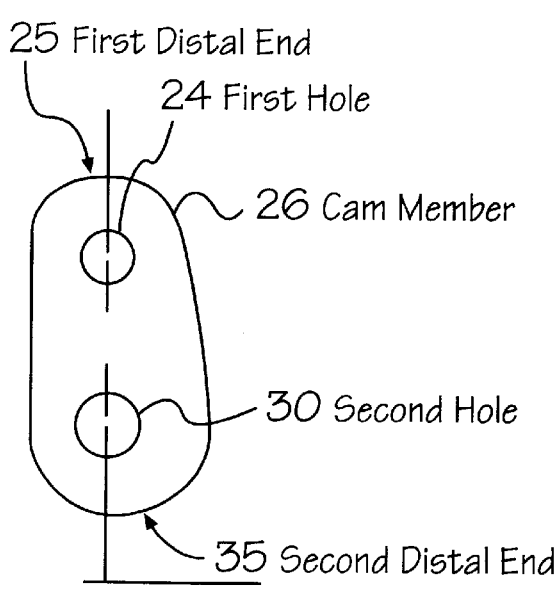
FIGS. 3a and 3b show respective plan and side views of the cam of the camming assembly depicted in FIG. 2.
Figure 3B:
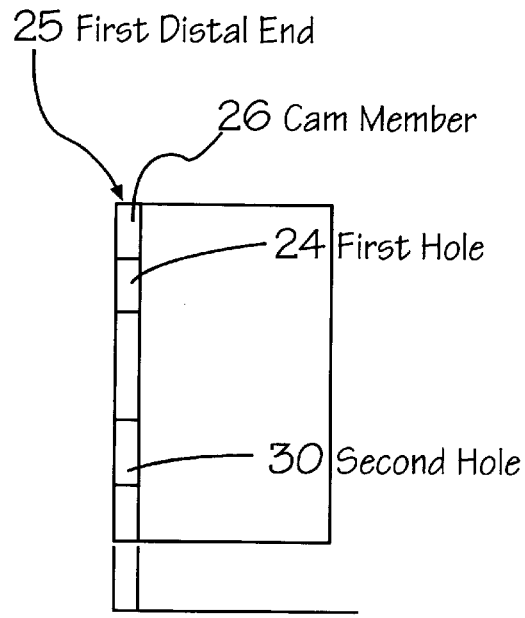

Referring to FIG. 2, the opposer cams 15 are shown in greater detail. The cams 15 are disposed adjacent the card edge 16, as aforementioned. Each of the cams 15 is pneumatically actuated by its respective pneumatic cylinders 18, shown in greater detail with reference to FIG. 6. Each cylinder 18 pushes a piston rod 20 against a spring (not shown). The rod 20 contacts a first pin 22, which is seated within a first hole 24 of the cam member 26, on a first distal end 25, as shown in FIGS. 3a and 3b. The first pin 22 is free to rotate in hole 24 of cam member 26, and projects into the slot 27 of the adjacent pivot block 28, as shown in greater detail with reference to FIG. 5.

Figure 4:
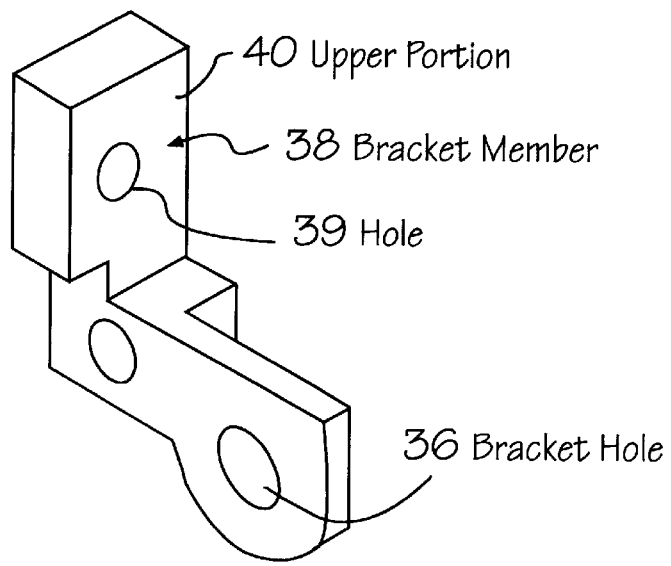
FIG. 4 illustrates a perspective view of the mounting bracket of the camming assembly shown in FIG. 2.
Figure 5:
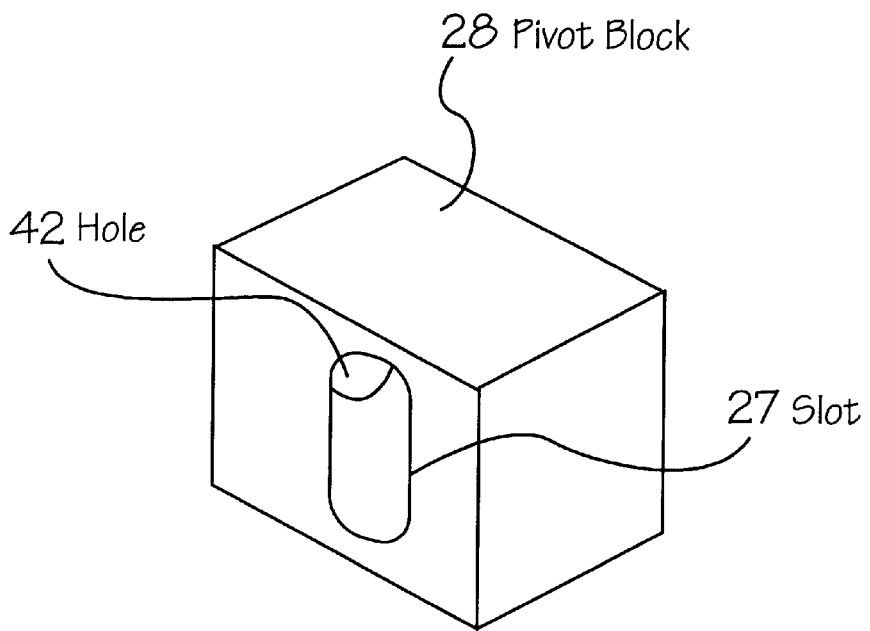
FIG. 5 depicts a perspective view of the mounting block of the camming assembly illustrated in FIG. 2.
Figure 6:
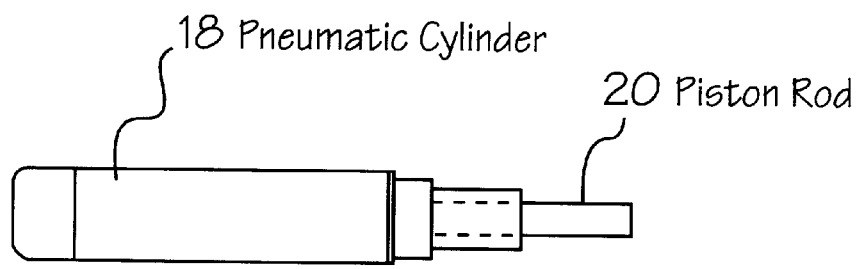
FIG. 6 shows a front view of the pneumatic cylinder of the camming assembly depicted in FIG. 2.

Each cam member 26 has a second hole 30 disposed adjacent the second distal end 35 (FIGS. 3a and 3b). A second pin 32 is free to rotate within hole 30, and projects into hole 36 of a bracket member 38, shown in FIG. 4. The bracket member 38 locates the cam member 26 with respect to the pneumatic cylinder 18. The bracket member 38 has a hole 39 disposed in an upper portion 40, which captures the piston rod 20. The piston rod 20 is also captured in hole 42 of the pivot block 28, as shown in FIG. 5. Both the piston rod 20 and the second pin 32 are movable within respective holes 30 and 36.

Actuation of the pneumatic cylinders 18 causes the piston rod 20 to push against first pin 22, thus causing each respective cam member 26 to pivot about the second pin 32 that is constrained within the bracket hole 36. The second distal end 35 of each cam member 26 is then caused to come into contact with edge 16 of the card under test 11.

Figure 7:
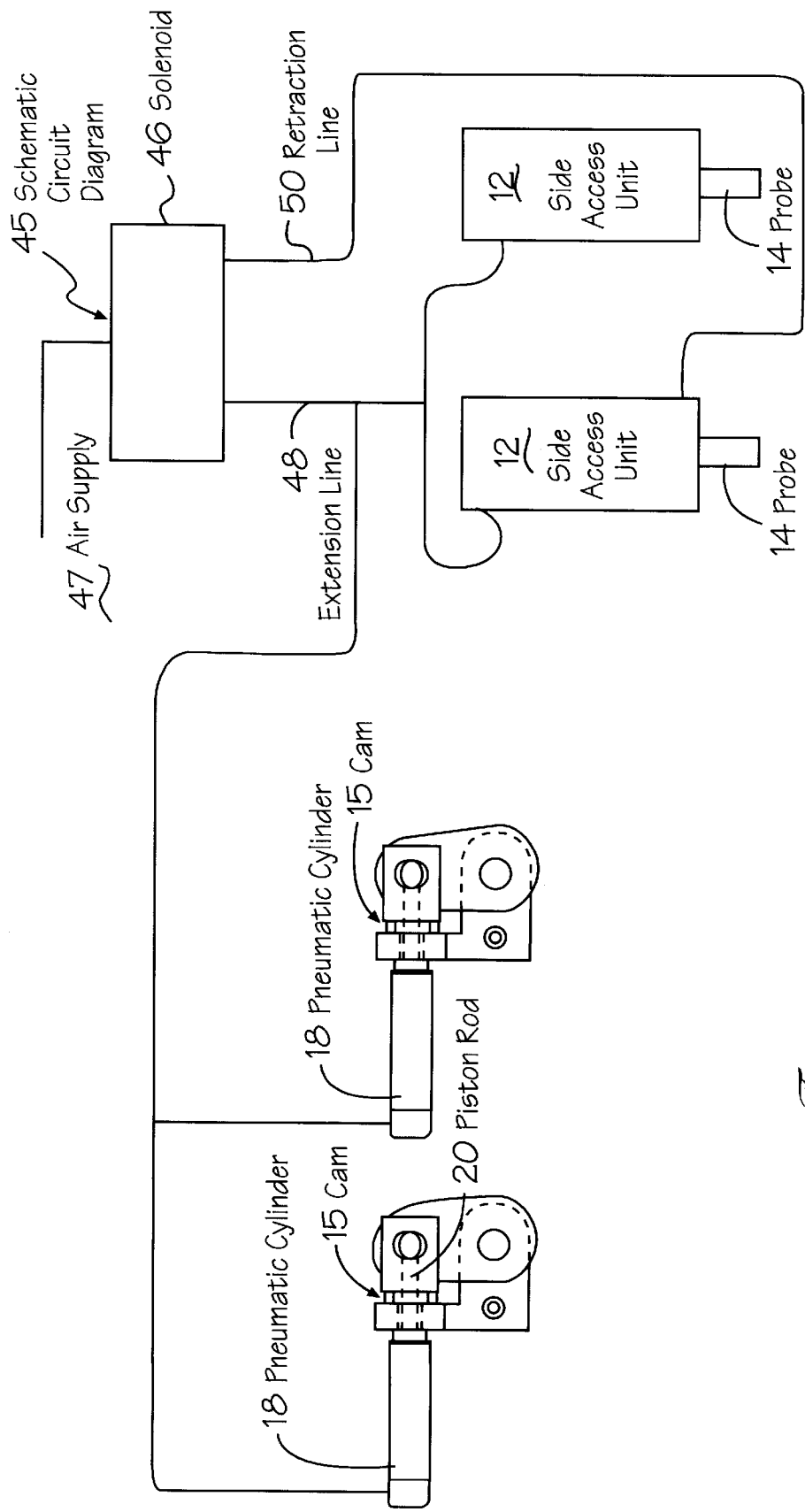
FIG. 7 illustrates a schematic diagram of the pneumatic system powering the Side Access Units and the pistons of the camming assembly, shown in FIG. 1.

Referring to FIG. 7, a schematic circuit diagram 45 of the pneumatic system is shown. The air supply 47 is controlled by solenoid 46. The solenoid 46 controls two lines: an extension line 48, and a retraction line 50. The air in the extension line 48 causes the probes 14 of each of the SAU units 12 to extend. The pressure created in the retraction line 50 causes the probes 14 to retract.

The extension line 48 also furnishes air to each of the pneumatic cylinders 18 of the opposer cam assembly 15. The opposer cams 15 do not communicate with the retraction line 50, because the piston rod 20 is spring biased into returning.

The test fixture 10 (FIG. 1) provides a pair of cams 15 oppositely situated from the SAU units 12. These cams 15 are pneumatically actuated slightly prior to, or instantaneously with, the SAU 12. The actuation of the cams 15 provides a mechanical stop with zero tolerance, so that the misalignment caused by the forward movement of the test probes 14 is eliminated. The pneumatically actuated cams 15 provide an opposing force that counteracts the force imparted by the probes 14 of the SAU 12, and is accurate up to 0.025" variation in the dimensions of the card edge. The test fixture provides alignment in both the "X" and "Y" axes.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A test fixture for probe testing electronic cards, comprising:

at least one test probe disposed adjacent an electronic card to be tested;

a pair of opposer cams disposed adjacent an edge of said electronic card opposite to said at least one test probe, said opposer cams being actuated into pivotal contact with said edge of said electronic card; and actuating means connected to said at least one test probe and said opposer cams for causing both said at least one test probe and said opposer cams to thrust against said electronic card.

2. The test fixture in accordance with claim 1, wherein said actuating means comprises a pneumatic circuit connected to said at least one test probe and said opposer cams for actuating said at least one test probe and said opposer cams substantially simultaneously with each other.

3. The test fixture in accordance with claim 1, wherein said opposer cams are spaced apart from each other about said edge of said electronic card.

4. The test fixture in accordance with claim 1, wherein each of said opposer cams comprises a pneumatic cylinder having a push rod, said push rod being in movable contact with a cam member on a first distal end thereof, and further wherein said cam member is pivotal about a second distal end thereof, in response to urging by said push rod upon said first distal end of said cam member.

5. The test fixture in accordance with claim 4, further comprising a bracket member for locating each of said cam members with respect to said pneumatic cylinder.

6. The test fixture in accordance with claim 4, further comprising a pivot block disposed opposite each cam member, said pivot block capturing a push rod of a respective pneumatic cylinder.

7. The test fixture in accordance with claim 6, wherein each of said pivot blocks has a slot for capturing a pin that is rotatively affixed to each cam member, and further wherein said pin is free to move in said slot upon the urging of said piston rod.

8. A test fixture for probe testing electronic cards, comprising:

at least one test probe disposed adjacent an electronic card to be tested;

a pair of pneumatically actuated opposer cams disposed adjacent an edge of said electronic card opposite to said at least one test probe, said opposer cams being pneumatically actuatable into pivotal contact with said edge of said electronic card; and pneumatic actuating means for causing both said at least one test probe and said opposer cams to thrust against said electronic card, said pneumatic actuating means defining a pneumatic circuit with said at least one test probe and said opposer cams.

9. The test fixture in accordance with claim 8, wherein said opposer cams are spaced apart from each other about said edge of said electronic card.

10. The test fixture in accordance with claim 8, wherein each of said opposer cams comprises a pneumatic cylinder having a push rod, said push rod being in movable contact with a cam member on a first distal end thereof, and further wherein said cam member is pivotal about a second distal end thereof, in response to urging by said push rod upon said first distal end of said cam member.

11. The test fixture in accordance with claim 10, further comprising a bracket member for locating each of said cam members with respect to said pneumatic cylinder.

12. The test fixture in accordance with claim 10, further comprising a pivot block disposed opposite each cam member, said pivot block capturing a push rod of a respective pneumatic cylinder.

13. The test fixture in accordance with claim 12, wherein each of said pivot blocks has a slot for capturing a pin that is rotatively affixed to each cam member, and further wherein said pin is free to move in said slot upon the urging of said push rod.

14. The test fixture in accordance with claim 8, wherein said pneumatic circuit comprises a solenoid that controls an extension line and a retraction line connected to said at least one test probe.

15. A test fixture for probe testing electronic cards, comprising:

at least one test probe disposed adjacent an electronic card to be tested;

a pair of opposer cams disposed adjacent an edge of said electronic card opposite to said at least one test probe, said opposer cams being actuated into pivotal contact with said edge of said electronic card, and being retractable therefrom; and actuating means for causing both said at least one test probe and said opposer cams to thrust against said electronic card.

16. The test fixture in accordance with claim 15, wherein said actuating means comprises a pneumatic circuit connected to said at least one test probe and said opposer cams.

17. The test fixture in accordance with claim 15, wherein said opposer cams are spaced apart from each other about said edge of said electronic card.

18. The test fixture in accordance with claim 15, wherein each of said opposer cams comprises a pneumatic cylinder having a push rod, said push rod being in movable contact with a cam member on a first distal end thereof, and further wherein said cam member is pivotal about a second distal end thereof, in response to urging by said push rod upon said first distal end of said cam member.

19. The test fixture in accordance with claim 18, further comprising a bracket member for locating each of said cam members with respect to said pneumatic cylinder.

20. The test fixture in accordance with claim 18, further comprising a pivot block disposed opposite each cam member, said pivot block capturing a piston rod of a respective pneumatic cylinder.

21. The test fixture in accordance with claim 20, wherein each of said pivot blocks has a slot for capturing a pin that is rotatively affixed to each cam member, and further wherein said pin is free to move in said slot upon the urging of said push rod.

* * * * *